United States Patent
Vo et al.

(10) Patent No.: US 9,000,490 B2
(45) Date of Patent: Apr. 7, 2015

(54) SEMICONDUCTOR PACKAGE HAVING IC DICE AND VOLTAGE TUNERS

(71) Applicant: Xilinx, Inc., San Jose, CA (US)

(72) Inventors: Thao H. T. Vo, San Jose, CA (US);
Andy H. Gan, San Jose, CA (US);
Xiao-Yu Li, Palo Alto, CA (US);
Matthew H. Klein, Redwood City, CA (US)

(73) Assignee: Xilinx, Inc., San Jose, CA (US)

( * ) Notice: Subject to any disclaimer, the term of this patent is extended or adjusted under 35 U.S.C. 154(b) by 71 days.

(21) Appl. No.: 13/866,893

(22) Filed: Apr. 19, 2013

(65) Prior Publication Data

US 2014/0312483 A1    Oct. 23, 2014

(51) Int. Cl.
G06F 1/32 (2006.01)
H01L 25/065 (2006.01)
G06F 17/50 (2006.01)

(52) U.S. Cl.
CPC ........ *H01L 25/0652* (2013.01); *G06F 17/5054* (2013.01); *G06F 17/5045* (2013.01); *G06F 1/3203* (2013.01); *G06F 1/324* (2013.01); *H01L 25/0655* (2013.01); *H01L 2224/0401* (2013.01); *H01L 2224/0557* (2013.01); *H01L 2224/06181* (2013.01); *H01L 2224/14181* (2013.01); *H01L 2224/16145* (2013.01); *H01L 2224/16225* (2013.01); *H01L 2224/48227* (2013.01); *H01L 2224/73257* (2013.01); *H01L 2924/15192* (2013.01); *H01L 2924/15311* (2013.01)

(58) Field of Classification Search
CPC ..... G06F 1/3237; G06F 1/324; G06F 1/3296; G06F 17/5045; G06F 17/5054

USPC .......................................... 257/209, E29.302
See application file for complete search history.

(56) References Cited

U.S. PATENT DOCUMENTS

| 4,698,760 | A | 10/1987 | Lembach et al. |
| 5,157,618 | A | 10/1992 | Ravindra et al. |
| 5,399,898 | A | 3/1995 | Rostoker |
| 5,448,198 | A | 9/1995 | Toyoshima et al. |
| 5,461,338 | A | 10/1995 | Hirayama et al. |
| 5,487,033 | A | 1/1996 | Keeney et al. |
| 5,504,440 | A | 4/1996 | Sasaki |

(Continued)

FOREIGN PATENT DOCUMENTS

| JP | 11-122047 | 4/1999 |
| JP | 2001-015603 | 1/2001 |

(Continued)

OTHER PUBLICATIONS

U.S. Appl. No. 12/392,065, filed Feb. 24, 2009, Rahman.

(Continued)

*Primary Examiner* — John C Ingham
(74) *Attorney, Agent, or Firm* — LeRoy D. Maunu

(57) ABSTRACT

A semiconductor package includes an interposer and a plurality of integrated circuit (IC) dice disposed on and intercoupled via the interposer. A first IC die has a clock speed rating that is greater than a clock speed rating of another of the IC dice. A plurality of programmable voltage tuners are coupled to the plurality of IC dice, respectively. A first voltage tuner is coupled to the first IC die, and the first voltage tuner is programmed to reduce a voltage level of voltage input to the first voltage tuner and output the reduced voltage to the first IC die.

14 Claims, 7 Drawing Sheets

(56) References Cited

U.S. PATENT DOCUMENTS

| | | |
|---|---|---|
| 5,612,636 A | 3/1997 | Ko |
| 5,654,898 A | 8/1997 | Roetcisoender et al. |
| 5,661,685 A | 8/1997 | Lee et al. |
| 5,682,062 A | 10/1997 | Gaul |
| 5,703,522 A | 12/1997 | Arimoto et al. |
| 5,742,178 A | 4/1998 | Jenkins, IV et al. |
| 5,787,011 A | 7/1998 | Ko |
| 5,808,479 A | 9/1998 | Sasaki et al. |
| 5,811,985 A | 9/1998 | Trimberger et al. |
| 5,815,004 A | 9/1998 | Trimberger et al. |
| 5,825,707 A | 10/1998 | Nozawa et al. |
| 5,880,598 A | 3/1999 | Duong |
| 5,880,620 A | 3/1999 | Gitlin et al. |
| 5,880,967 A | 3/1999 | Jyu et al. |
| 5,892,961 A | 4/1999 | Trimberger |
| 5,914,616 A | 6/1999 | Young et al. |
| 5,917,709 A | 6/1999 | Johnson et al. |
| 5,984,510 A | 11/1999 | Guruswamy et al. |
| 5,995,379 A | 11/1999 | Kyougoku et al. |
| 6,097,113 A | 8/2000 | Teraoka et al. |
| 6,150,724 A | 11/2000 | Wenzel et al. |
| 6,163,168 A | 12/2000 | Nguyen et al. |
| 6,178,542 B1 | 1/2001 | Dave |
| 6,269,458 B1 | 7/2001 | Jeter et al. |
| 6,272,668 B1 | 8/2001 | Teene |
| 6,348,813 B1 | 2/2002 | Agrawal et al. |
| 6,362,649 B1 | 3/2002 | McGowan |
| 6,369,630 B1 | 4/2002 | Rockett |
| 6,448,808 B2 | 9/2002 | Young et al. |
| 6,505,322 B2 | 1/2003 | Yamashita et al. |
| 6,539,536 B1 | 3/2003 | Singh et al. |
| 6,577,013 B1 | 6/2003 | Glenn et al. |
| 6,583,645 B1 | 6/2003 | Bennett et al. |
| 6,590,419 B1 | 7/2003 | Betz et al. |
| 6,604,228 B1 | 8/2003 | Patel et al. |
| 6,621,325 B2 | 9/2003 | Gitlin et al. |
| 6,630,838 B1 | 10/2003 | Wong |
| 6,721,924 B2 | 4/2004 | Patra et al. |
| 6,777,978 B2 | 8/2004 | Hart et al. |
| 6,882,045 B2 | 4/2005 | Massingill et al. |
| 6,903,443 B2 | 6/2005 | Farnworth et al. |
| 6,930,510 B2 | 8/2005 | New |
| 6,950,998 B1 | 9/2005 | Tuan |
| 7,068,072 B2 | 6/2006 | New et al. |
| 7,089,527 B2 | 8/2006 | Hart et al. |
| 7,138,828 B2 | 11/2006 | New |
| 7,276,799 B2 | 10/2007 | Lee et al. |
| 7,323,771 B2 | 1/2008 | Fujita et al. |
| 7,337,100 B1 | 2/2008 | Hutton et al. |
| 7,367,503 B2 | 5/2008 | Harai et al. |
| 7,412,668 B1 | 8/2008 | Duong |
| 7,435,910 B2 | 10/2008 | Sakamoto et al. |
| 7,466,028 B1 | 12/2008 | Yu et al. |
| 7,493,247 B2 | 2/2009 | Memmi |
| 7,509,608 B1 | 3/2009 | Duong |
| 7,518,398 B1 | 4/2009 | Rahman et al. |
| 7,538,033 B2 | 5/2009 | Trezza |
| 7,557,367 B2 | 7/2009 | Rogers et al. |
| 7,605,458 B1 | 10/2009 | Rahman et al. |
| 7,619,441 B1 * | 11/2009 | Rahman et al. ............ 326/38 |
| 7,765,686 B2 | 8/2010 | Murakami et al. |
| 7,838,997 B2 | 11/2010 | Trezza |
| 7,904,864 B2 | 3/2011 | Huynh et al. |
| 7,989,959 B1 | 8/2011 | Rahman |
| 8,082,537 B1 | 12/2011 | Rahman |
| 8,390,035 B2 * | 3/2013 | Bemanian et al. ............ 257/209 |
| 8,692,561 B2 * | 4/2014 | Cordero et al. ............ 324/601 |
| 2001/0048319 A1 | 12/2001 | Miyazaki et al. |
| 2002/0069396 A1 | 6/2002 | Bhattacharya et al. |
| 2002/0139577 A1 | 10/2002 | Miller |
| 2002/0163826 A1 * | 11/2002 | Devlin et al. ............ 365/63 |
| 2003/0066037 A1 | 4/2003 | Patra et al. |
| 2004/0061238 A1 | 4/2004 | Sekine |
| 2006/0113598 A1 | 6/2006 | Chen et al. |
| 2008/0150088 A1 | 6/2008 | Reed et al. |
| 2008/0178023 A1 | 7/2008 | Kim et al. |
| 2008/0244278 A1 | 10/2008 | Monferrer et al. |
| 2009/0020855 A1 | 1/2009 | Pyeon |
| 2009/0230552 A1 | 9/2009 | Pendse |
| 2009/0281772 A1 | 11/2009 | Jamann et al. |
| 2009/0315627 A1 | 12/2009 | Bereza et al. |
| 2009/0319968 A1 | 12/2009 | Wang et al. |
| 2009/0321947 A1 | 12/2009 | Pratt |
| 2010/0259296 A1 | 10/2010 | Or-Bach |
| 2010/0270597 A1 | 10/2010 | Sproch et al. |
| 2010/0289124 A1 | 11/2010 | Nuzzo et al. |
| 2011/0018573 A1 | 1/2011 | Hamada et al. |
| 2011/0036396 A1 | 2/2011 | Jayaraman et al. |
| 2011/0131427 A1 * | 6/2011 | Jorgenson et al. ............ 713/300 |
| 2011/0276321 A1 | 11/2011 | Tuan et al. |

FOREIGN PATENT DOCUMENTS

| | | |
|---|---|---|
| JP | 2001-068606 | 3/2001 |
| JP | 11-195976 | 7/2005 |
| JP | 2005-339052 | 12/2005 |
| JP | 2007-053761 | 3/2007 |
| JP | 2009-237972 | 10/2009 |
| WO | WO 00/52826 A | 9/2000 |
| WO | WO 01/28097 A | 4/2001 |

OTHER PUBLICATIONS

Betz, Vaughn et al., "FPGA Routing Architecture: Segmentation and Buffering to Optimize Speed and Density," *Proc. of the 1999 ACM/SIGDA 7th International Symposium on Field Programmable Gate Arrays*, Feb. 21-23, 1999, pp. 59-68, ACM, New York, NY, USA.

Chow, C.T. et al., "Dynamic Voltage Scaling for Commercial FPGAs," *Proc. of the 2005 IEEE International Conference on Field-Programmable Technology*, Dec. 11, 2005, pp. 173-180, IEEE, Piscataway, NJ, USA.

Dobbelaere, Ivo et al., "Regenerative Feedback Repeaters for Programmable Interconnections," *IEEE Journal of Solid-State Circuits*, Nov. 1, 1995, pp. 1246-1253, vol. 30, No. 11, IEEE, Piscataway, NJ, USA.

Hutton, Micahel et al., "Interconnect Enhancements for a High-Speed PLD Architecture," *Proc. of the ACM/SIGDA International Symposium on Field Programmable Gate Arrays*, Feb. 24, 2002, pp. 1-8, ACM, New York, NY, USA.

Kuroda, Tadahiro et al., "A 0.9 V 150 MHz 10-mW 4 mm$^2$ 2-D Discrete Cosine Transform Core Processor with Variable-Threshold-Voltage Scheme," *Digest of Technical Papers of the 42nd IEEE International Solid-State Circuits Conference*, Feb. 8, 1996, pp. 166-167, 437, IEEE, Piscataway, NJ, USA.

Kuroda, Tadahiro et al., "A High-Speed Low-Power 0.3 μm CMOS Gate Array with Variable Threshold Voltage (VT) Scheme," *Proc. of the IEEE 1996 Custom Integrated Circuits Conference*, May 5, 1996, pp. 53-56, IEEE, Piscataway, NJ, USA.

Lin, Yan et al., "Circuit and Architectures for Field Programmable Gate Array with Configurable Supply Voltage," *IEEE Transactions on Very Large Scale Integration (VLSI) Systems*, Sep. 1, 2005, pp. 1035-1047, vol. 13, No. 9, IEEE, Piscataway, NJ, USA.

Nose, Koichi et al., "$V_{TH}$-hopping Scheme for 82% Power Saving in Low-Voltage Processors," *Proc. of the IEEE 2001 Custom Integrated Circuits Conference*, May 6, 2001, pp. 93-96, IEEE, Piscataway, NJ, USA.

Wang, Ping-Tsung et al., "A Hierarchical Interconnection Structure for Field-Programmable Gate Arrays," *Proc. of the Region 10 Conference on Computer, Communication, and Power Engineering*, Oct. 19, 1993, pp. 557-560, vol. 1, IEEE, Piscataway, NJ, USA.

Xilinx, Inc., *Virtex-II Platform FPGA Handbook*, UG002 (v1.0), Dec. 6, 2000, pp. 33-75, Xilinx, Inc., San Jose, California. 95124.

Nakahira, Hiroyuki et al., "A Lean Power Management Technique: The lowest power consumption for the given operating speeds of LSIs," *1997 Symposium on VLSI Circuits Digest of Technical Papers*, Jun. 12, 1997, pp. 99-100, IEEE, Piscataway, New Jersey, USA.

\* cited by examiner

SEMICONDUCTOR PACKAGE HAVING IC DICE AND VOLTAGE TUNERS

TECHNICAL FIELD

The disclosure generally relates to multi-die semiconductor packages having dice with different clock speed ratings.

BACKGROUND

Electronic devices of the same function and type are often sold in different speed grades (e.g., able to function at different clock frequencies). Some such devices may have multiple integrated circuit (IC) dice of the same type and function stacked in a package. These IC dice of the same type may have been based on the same design specification, but due to manufacturing variability, the dice may have different maximum attainable operating clock frequencies (or clock speed ratings).

In order to maintain the proper setup and hold times between the IC dice in the package, the differences in speed between the IC dice chosen for the package must not be too great. Thus, the manufactured IC dice may be sorted into groups in which each group has IC dice having speeds that are within a suitable range for each group. The groups are sometimes referred to as bins. The IC dice in a bin may have many different speeds, though all fall within a designated range of speeds for that bin. Each device or package may be constructed using multiple dice from a particular bin. The packages built from the IC dice of one bin may have a different speed grade than the speed grade of packages built from the IC dice of another bin.

The range of speeds of IC dice in a bin may permit use of any of the IC dice from the bin in constructing a package without jeopardizing proper setup and hold times. However, in order to meet power ratings for the packages, some ratio of slow IC dice (dice having lower clock speed ratings) to fast IC dice (dice having higher clock speed ratings) from a bin may be used in each package. For example, a package may be constructed with three slower IC dice and one faster IC die from a bin. However, the ratio of slower IC dice to faster IC dice in the bin may not be commensurate with the desired ratio for the packages. If there are too many fast dice and too few slow dice, then some fast dice may be scrapped, resulting in increased manufacturing costs.

SUMMARY

A semiconductor package includes an interposer and a plurality of integrated circuit (IC) dice disposed on and intercoupled via the interposer. A first IC die of the plurality of IC dice has a clock speed rating that is greater than a clock speed rating of another of the IC dice. A plurality of programmable voltage tuners are coupled to the plurality of IC dice, respectively. A first voltage tuner of the plurality of voltage tuners is coupled to the first IC die, and the first voltage tuner is programmed to reduce a voltage level of voltage input to the first voltage tuner and output the reduced voltage to the first IC die.

A method of building an electronic system is also provided. The method includes determining respective clock speed ratings of a plurality of IC dice. A first IC die of the plurality of IC dice is determined to have a clock speed rating that is greater than a clock speed rating of another of the IC dice. Respective voltage levels are determined for the plurality of IC dice based on the respective clock speed ratings and a target power profile of the electronic system. The IC dice are attached to an interposer, and each of the IC dice on the interposer is coupled to a respective voltage tuner of a plurality of voltage tuners. Each respective voltage tuner is programmed to supply the respective voltage level to one of the IC dice on the interposer.

An electronic system is also provided. The system includes a printed circuit board and a semiconductor package mounted on the printed circuit board. The semiconductor package includes a package substrate, an interposer disposed on the package substrate, and a plurality of integrated circuit (IC) dice disposed on and intercoupled via the interposer. A first IC die of the plurality of IC dice has a clock speed rating that is greater than a clock speed rating of another of the IC dice. A plurality of programmable voltage tuners are disposed on the printed circuit board and are coupled to the plurality of IC dice, respectively. A first voltage tuner of the plurality of voltage tuners is coupled to the first IC die, and the first voltage tuner is programmed to reduce a voltage level of voltage input to the first voltage tuner and output the reduced voltage to the first IC die.

Other features will be recognized from consideration of the Detailed Description and Claims, which follow.

BRIEF DESCRIPTION OF THE DRAWINGS

Various aspects and features of the circuit and method will become apparent upon review of the following detailed description and upon reference to the drawings, in which.

DETAILED DESCRIPTION

In order to address issues associated with an undesired distribution of fast dice to slow dice in a bin, semiconductor packages that are built having multiple IC dice from the bin can be made to include respective voltage tuners for the IC dice. The voltage tuners provide control over the power consumption of each IC die in a package, thereby permitting more of the faster dice to be used in a package than would be permitted without the voltage tuners. For example, if three slower IC dice and one faster IC die are to be used in building an IC package to satisfy a power rating, but there are too many faster dice and too few slower dice in the bin to accommodate this ratio, the faster dice from the bin may be used in place of the slower dice in the package. The input voltages to the faster dice in the package may be reduced by the voltage tuners in order to reduce the power consumption of those faster dice.

Since it is known that reducing the input voltage reduces the power consumption and operating speed of an IC die, the faster dice may be controlled to operate as though they were slower dice.

Figure 1:
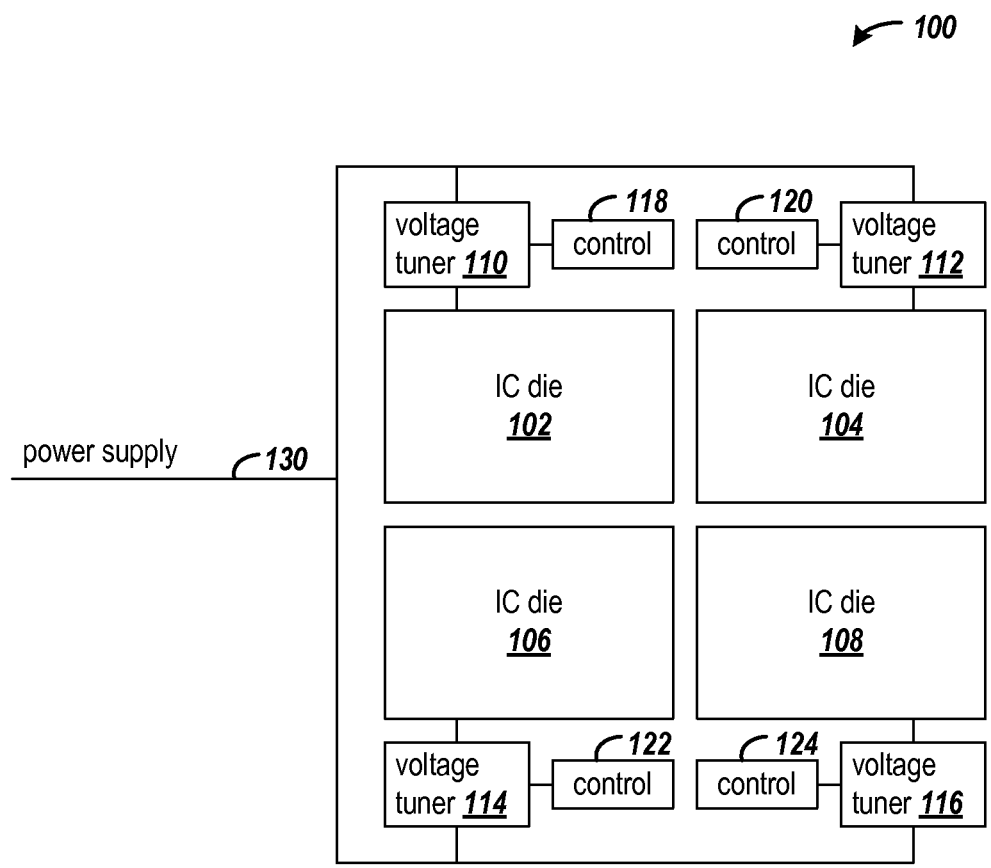
FIG. 1 shows an IC package in which each IC die of the package has power controlled by a respective voltage tuner.

FIG. 1 shows an IC package 100 in which each IC die of the package has power controlled by a respective voltage tuner. The example package includes IC dice 102, 104, 106, and 108, which have supply voltages controlled by voltage tuners 110, 112, 114, and 116, respectively. Each of the voltage tuners is individually programmable, as shown by control elements 118, 120, 122, and 124. Power is provided to the voltage tuners by power supply line 130.

The IC dice 102, 104, 106, and 108 may be disposed on and intercoupled by an interposer (not shown). Though four IC dice are shown, it will be appreciated that a package may include more or fewer IC dice depending on application requirements. The package shown in FIG. 1 may represent an application in which a ratio of three slower IC dice to one faster IC die is preferred to achieve a desired power rating for the package. If there are too few slower IC dice and too many faster IC dice in the bin from which the package is constructed, a faster die may be substituted for one or more of the desired slower dice. For example, had the distribution of slower to faster IC dice in the bin been 3:1 as preferred for the application, then the package could have been made with IC dice 102, 104, and 106 being slower IC dice and IC die 108 being a faster IC die. However, if the distribution of slower to faster IC dice in the bin is 1:1 instead of 3:1, then more than just IC die 108 may be a faster IC die. For example, one or more of IC dice 102, 104 or 106 may also be a faster IC die. The voltage tuner(s) coupled to the one or more of IC dice 102, 104, and 106 that are faster dice may be programmed to reduce the supply voltage(s) to the one or more dice, resulting in the package having the desired power rating. The voltage tuners that are coupled to the slower dice may be programmed to pass the input supply voltage without change to the respective IC dice.

It will be appreciated that implementations of the voltage tuners and control elements may vary according to application requirements. In example implementations, each voltage tuner may be a series of one or more resistors that are selected by a programmed value in the control element. The control elements may be PROM, EPROM, or EEPROMs, or EFUSEs, for example.

The IC dice may be functionally different or functionally equivalent to one another. For example, the IC dice may be different application specific integrated circuit (ASICs) dice or may be functionally equivalent instances of a field programmable gate array (FPGA) die.

If there are no slower IC dice in a bin to use in combination with the faster IC die in the bin, then all faster dice may be used in making a semiconductor package. The voltage tuners of all the IC dice in the package may be programmed to reduce the supply voltages to the IC dice to suitable levels.

Figure 2:
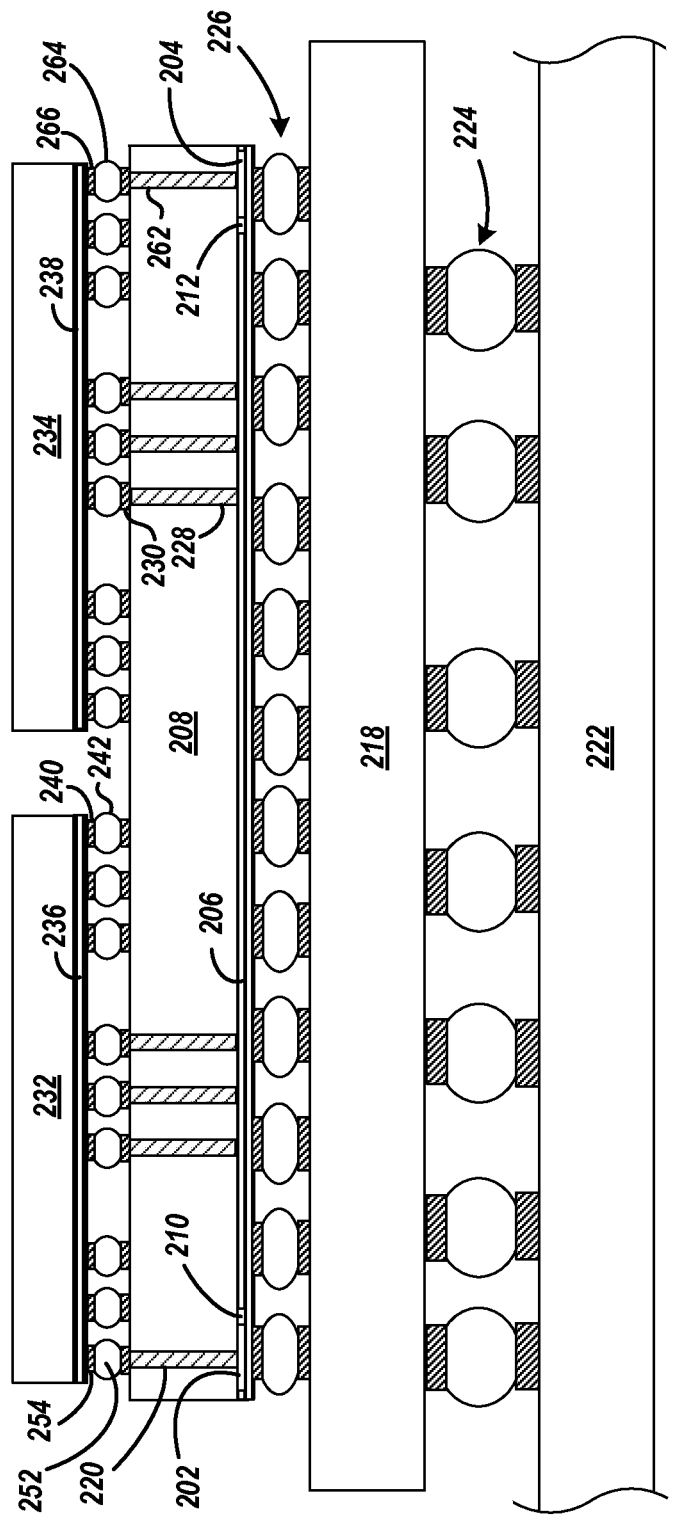
FIG. 2 shows a cross-sectional view of an IC package having multiple IC dice, and each of the IC dice having a respective voltage tuner and programmable control element.

FIG. 2 shows a cross-sectional view of an IC package having multiple IC dice, and each of the IC dice having a respective voltage tuner and programmable control element. The voltage tuners 202 and 204 are disposed in the circuit layer 206 of the interposer 208 (or mother die). The control elements 210 and 212 are also disposed in the circuit layer of the interposer.

The semiconductor package includes interposer 208, daughter IC dice 232 and 234, and package substrate 218. Though only two IC dice 232 and 234 are shown, it will be appreciated that additional dice may be included in the package in different implementations. The assembly is typically encapsulated in a packaging material (not shown). The semiconductor package is mounted to printed circuit board 222 by means of solder ball grid array (BGA) 224. The ball grid array, along with the associated substrate and printed circuit board contact pads, provides electrical and mechanical connectivity between the semiconductor package and the external environment.

Interposer 208, which is mounted to package substrate 218 by solder bump array 226, includes a semiconductor substrate, typically silicon, which provides a base for circuit layer 206 and integrated circuitry that is formed on the face, or bottom surface, of the die. Through-silicon vias (TSVs) (e.g., TSV 228) are formed in the silicon to provide electrical conductivity between the circuit layer 206 and back, or upper surface, contact pads 230.

Daughter IC dice 232 and 234 have integrated circuitry layers 236 and 238, respectively. The face of each daughter IC die is typically populated with an array of contact pads (e.g., contact pad 240) coupled to the integrated circuitry layers. Solder bumps (e.g., solder bump 242) provide electrical connection between the integrated circuitry of daughter IC dice and the integrated circuitry of the interposer 208.

The voltage tuners 202 and 204 receive a supply voltage via one or more of the solder bumps of solder bump array 226, the package substrate 218, a solder bump of bump array 224, and printed circuit board 222. The supply voltage may be distributed to the voltage tuners via circuit layer 206 of the interposer. An output node (not shown) of voltage tuner 202 is connected to TSV 220, which is coupled to IC die 232 by way of solder bump 252 and contact pad 254. The contact pad 254 is connected to the circuit layer 236 of IC die 232, and the contact pad with the solder bump 252 may be referred to as the power node, bump, or pin of the IC die. An output node (not shown) of voltage tuner 204 is similarly coupled to IC die 234 by way of TSV 262, solder bump 264, and contact pad 266.

The control elements 210 and 212 may be programmed by scan-test circuitry or by programming EFUSEs, for example.

Figure 3:
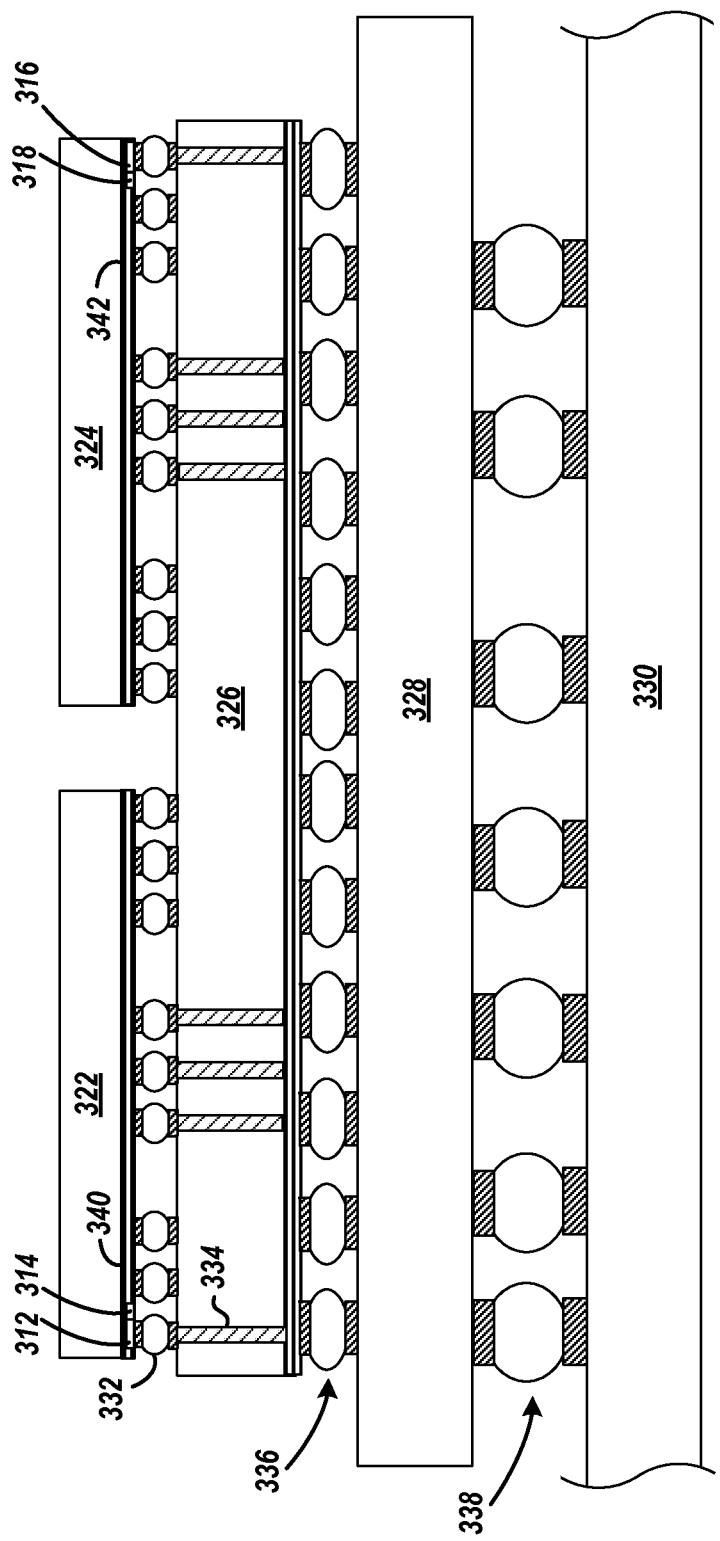
FIG. 3 shows a cross-sectional view of an IC package having multiple IC dice, and each of the IC dice having a respective voltage tuner and programmable control element disposed therein.

FIG. 3 shows a cross-sectional view of an IC package having multiple IC dice, and each of the IC dice having a respective voltage tuner and programmable control element disposed therein. The voltage tuners 312 and 316, along with the programmable control elements 314 and 318 are disposed in the IC dice 322 and 324. The IC dice 322 and 324 are mounted on interposer 326, which is mounted on package substrate 328. Supply voltage is input to voltage tuner 312 by way of solder connection 332, TSV 334, a solder connection in array 336, vias and routing wires (not shown) of package substrate 328, a solder connection in array 338, and vias and routing wires (not shown) of printed circuit board 330. The structure by which the IC dice are attached to the interposer, the interposer is attached to the package substrate, and the package substrate is attached to the printed circuit board 330 may be similar to that shown in FIG. 2 and described above.

The voltage tuner 312 and programmable control element 314 are formed in IC die 322 as part of the circuit layer 340. Similarly, the voltage tuner 316 and programmable control element 318 are formed in IC die 324 as part of the circuit layer 342. The input node (not shown) of voltage tuner 312 receives the supply voltage from solder connection 332, and the output node (not shown) of the voltage tuner is coupled to the supply voltage wiring in the circuit layer 340. Coupling between the programmable control element 318 and the voltage tuner is provided by signal lines in the circuit layer 342. Voltage tuner 316 and programmable control element 318 are similarly disposed in IC die 324. The control elements 314 and 318 may be programmed by scan-test circuitry or by programming EFUSEs, for example.

Figure 4:
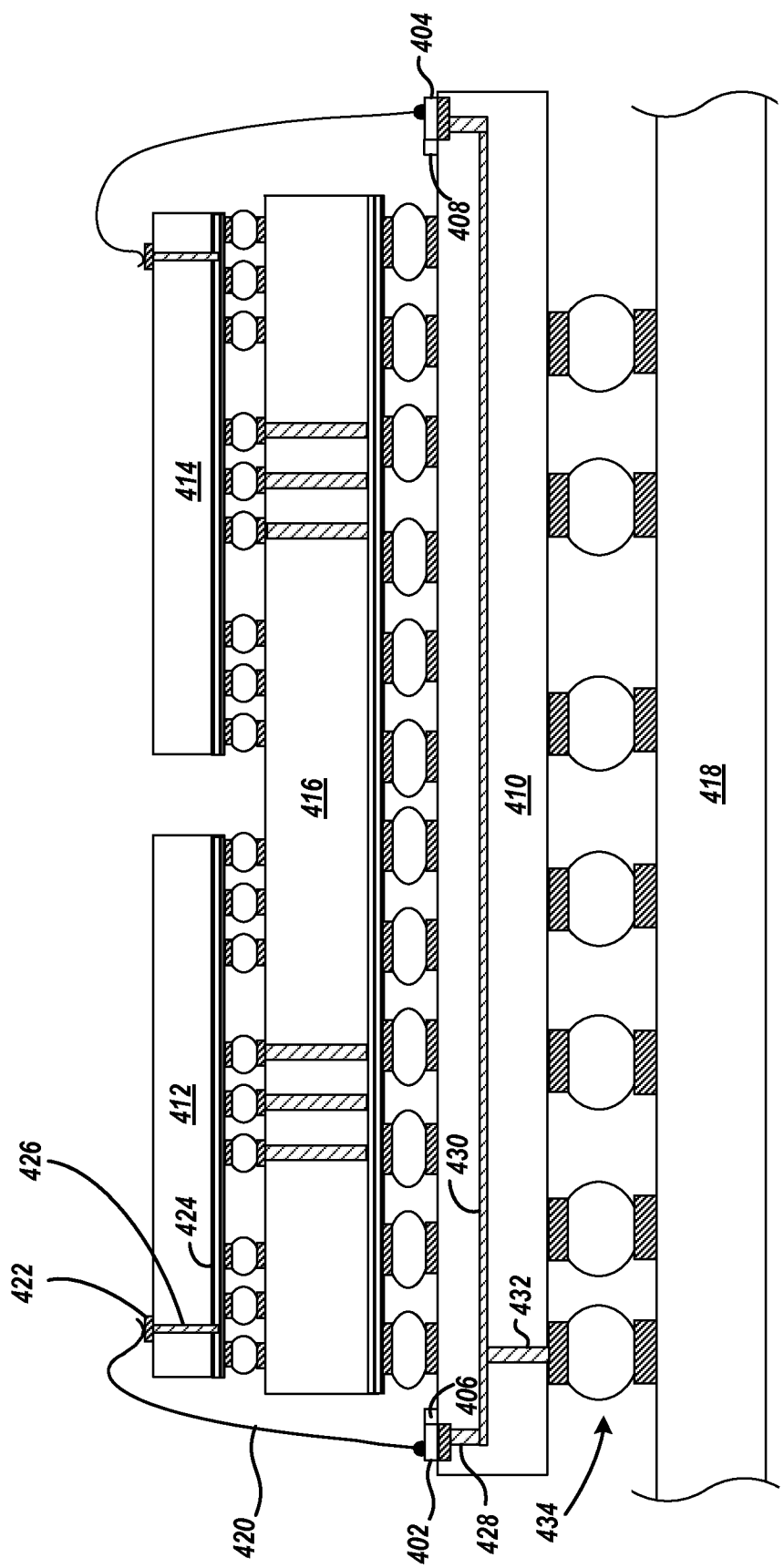
FIG. 4 shows a cross-sectional view of an IC package having multiple IC dice, and respective voltage tuners attached to the package substrate.

FIG. 4 shows a cross-sectional view of an IC package having multiple IC dice, and respective voltage tuners attached to the package substrate. The voltage tuners 402 and 404, along with the programmable control elements 406 and 408 are disposed on package substrate 410. The IC dice 412 and 414 are mounted on interposer 416, which is mounted on package substrate 410, which is mounted on printed circuit board 418. The structure by which the IC dice are attached to the interposer, the interposer is attached to the package substrate, and the package substrate is attached to the printed circuit board 418 may be similar to that shown in FIG. 2 and described above.

Wirebond 420 connects the output node (not shown) of voltage tuner 402 to a power pad 422 of IC die 412. The power pad is connected to the circuit layer 424 of IC die 412 by TSV 426. Voltage tuner 404 is similarly connected to IC die 414. Supply voltage is input to voltage tuner 402 by way of via 428, power line 430, via 432, a solder connection in array 434, and vias and routing wires (not shown) of printed circuit board 418. Supply voltage is similarly provided as input to voltage tuner 404.

The voltage tuners 402 and 404 and programmable control elements 406 and 408 are surface mounted to package substrate 410. The control elements may be programmed by scan-test circuitry or by programming EFUSEs, for example.

Figure 5:
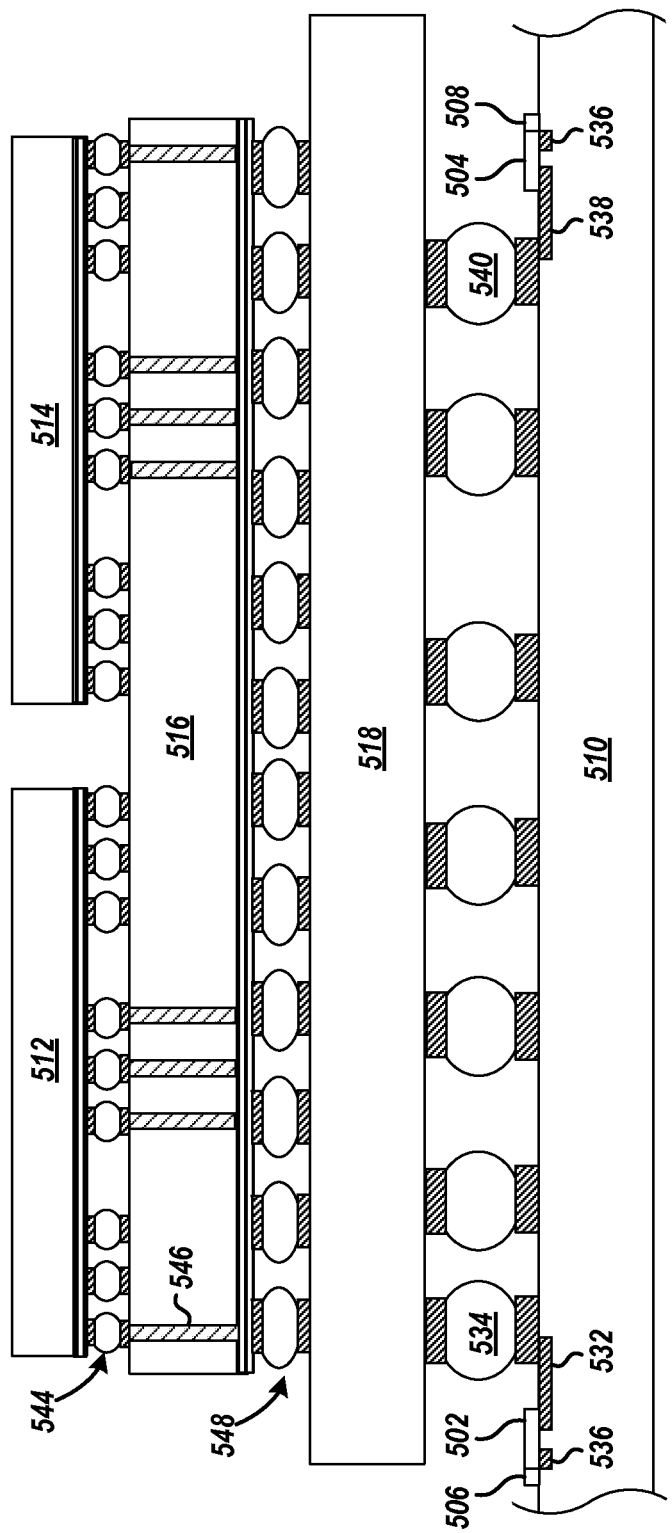
FIG. 5 shows a cross-sectional view of an IC package having multiple IC dice, and respective voltage tuners attached to the printed circuit board.

FIG. 5 shows a cross-sectional view of an IC package having multiple IC dice, and respective voltage tuners attached to the printed circuit board. The voltage tuners 502 and 504, along with the programmable control elements 506 and 508 are disposed on printed circuit board 510. The IC dice 512 and 514 are mounted on interposer 516, which is mounted on package substrate 518, which is mounted on printed circuit board 510. The structure by which the IC dice are attached to the interposer, the interposer is attached to the package substrate, and the package substrate is attached to the printed circuit board 510 may be similar to that shown in FIG. 2 and described above.

Printed circuit trace 532 connects the output node (not shown) of voltage tuner 502 to a solder connection 534. The supply voltage is connected to the input node (not shown) by printed circuit trace 536. Printed circuit trace 538 connects the output node (not shown) of voltage tuner 504 to a solder connection 540. The supply voltage is connected to the input node (not shown) by printed circuit trace 542, which may be connected to trace 536 by another printed circuit trace (not shown).

A supply voltage is input to IC die 512 by way of one of solder connections 544, a via (e.g., via 546), one of solder connections 548, one or more vias and conductive lines (not shown) in package substrate 518, and solder connection 534, which is connected to the output node of voltage tuner 502. A supply voltage is similarly provided to IC die 514.

The voltage tuners 502 and 504 and programmable control elements 506 and 508 are surface mounted to printed circuit board 510. The control elements may be programmed by scan-test circuitry or by programming EFUSEs, for example.

Figure 6:
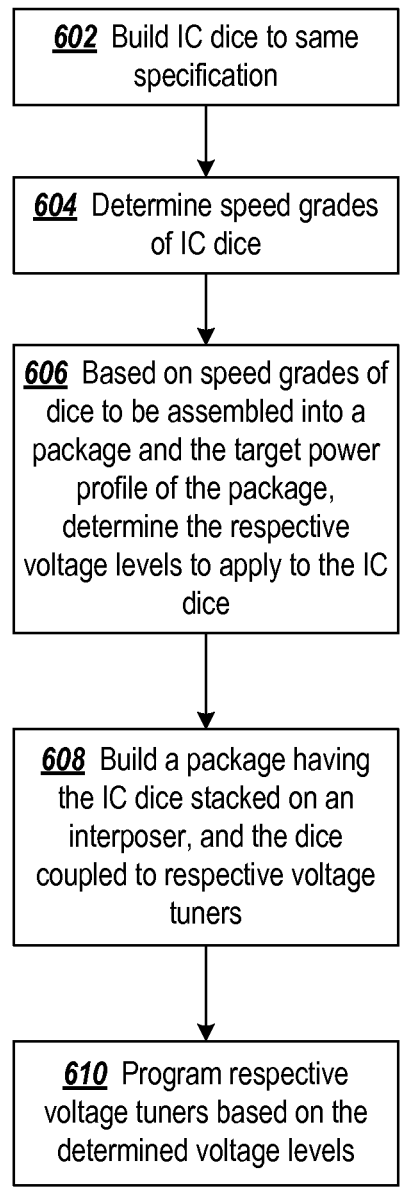
FIG. 6 is a flowchart of a process for making a semiconductor package having IC dice and associated voltage tuners.

FIG. 6 is a flowchart of a process for making a semiconductor package having IC dice and associated voltage tuners. At block 602, multiple IC dice are fabricated. In an example application, the dice may be built to the same specification. At block 604, the speed grade of each die is determined. The speed grade may be the maximum clock speed at which the IC die may be operated. Based on the individual speed grades of the dice and the target power profile of the semiconductor package to be constructed, at block 606 the desired supply voltage levels are determined for the dice to be used to make the package. The target power profile may specify the maximum level of power that the semiconductor package should consume. To comply with the target power profile, the voltage level to one or more of the IC dice may be reduced. At block 608, a package is constructed with the dice stacked on an interposer and the dice having power nodes coupled to respective voltage tuners. The voltage tuners are programmed at block 610 to provide the desired level of supply voltages to the IC dice.

Figure 7:
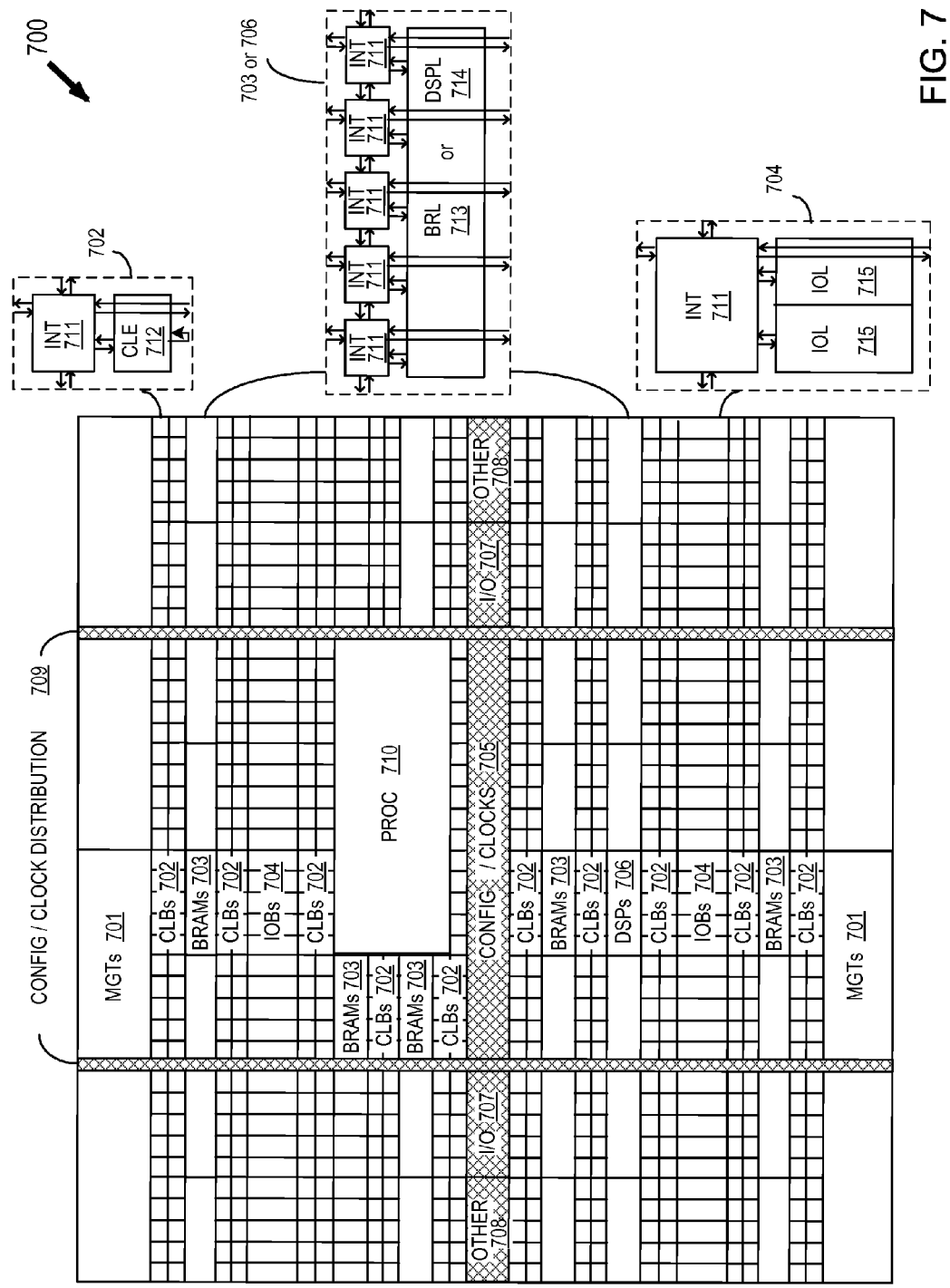
FIG. 7 is a block diagram of an example programmable logic IC that may be made from one or multiple IC dice in accordance with the teachings cited above.

FIG. 7 is a block diagram of an example programmable logic IC that may be made from one or multiple IC dice in accordance with the teachings cited above. The example programmable IC is a field programmable gate array (FPGA). However, the structures and methods described herein are not limited to FPGAs or other programmable logic ICs, but can be applied to other ICs, including non-programmable ICs, partially programmable ICs, or any combination of programmable, non-programmable, or partially programmable ICs.

FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), for example, e.g., clock ports, and other programmable logic 708 such as digital clock managers, analog-to-digital converters, system monitoring logic, and so forth. Some FPGAs also include dedicated processor blocks (PROC 710) and internal and external reconfiguration ports (not shown).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured FPGA, a horizontal area near the center of the die (shown shaded in FIG. 7) is used for configuration, clock, and other control logic. Vertical areas 709 extending from this horizontal area are used to distribute the clocks and configuration signals across the breadth of the FPGA.

Some FPGAs utilizing the architecture illustrated in FIG. 7 include additional logic blocks that disrupt the regular row structure making up a large part of the FPGA. The additional logic blocks can be programmable blocks and/or dedicated logic. For example, the processor block PROC 710 shown in FIG. 7 spans several rows of CLBs and BRAMs.

Note that FIG. 7 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The disclosed features are thought to be applicable to a variety of semiconductor packages. Other aspects and features will be apparent to those skilled in the art from consideration of the specification. It is intended that the specification and drawings be considered as examples only, with a true scope of the invention being indicated by the following claims.

What is claimed is:

1. A semiconductor package, comprising:
   an interposer;
   a plurality of integrated circuit (IC) dice disposed on and intercoupled via the interposer, a first IC die of the plurality of IC dice having a clock speed rating that is greater than a clock speed rating of another of the IC dice; and
   a plurality of programmable voltage tuners disposed in the interposer and coupled to the plurality of IC dice for providing power to the plurality of IC dice, respectively, wherein:
      a first voltage tuner of the plurality of voltage tuners is coupled to the first IC die; and
      the first voltage tuner is programmed to reduce a voltage level of voltage input to the first voltage tuner and output the reduced voltage to the first IC die.

2. The semiconductor package of claim 1, wherein voltage tuners of the plurality of voltage tuners other than the first voltage tuner are programmed to provide the input voltage without change to the respective IC dice.

3. The semiconductor package of claim 1, wherein each voltage tuner of the plurality of voltage tuners is programmed to reduce a voltage input to the voltage tuner and output the reduced voltage to the respective IC die.

4. The semiconductor package of claim 1, further comprising:
   a package substrate;
   wherein the interposer is disposed on the package substrate.

5. The semiconductor package of claim 1, wherein the IC dice are functionally equivalent.

6. The semiconductor package of claim 1, wherein the IC dice are field programmable gate arrays.

7. The semiconductor package of claim 1, wherein the IC dice are functionally different.

8. A method of building an electronic system, comprising:
   determining respective clock speed ratings of a plurality of IC dice;
   determining respective voltage levels for the plurality of IC dice based on the respective clock speed ratings and a target power profile of the electronic system;
   attaching the IC dice to an interposer having a plurality of voltage tuners disposed in a circuit layer of the interposer for providing power to the plurality of IC dice;
   coupling each of the IC dice on the interposer to a respective one of the plurality of voltage tuners; and
   programming each respective voltage tuner to supply the respective voltage level to one of the IC dice on the interposer.

9. The method of claim 8, wherein:
   a first IC die of the plurality of IC dice has a clock speed rating that is greater than a clock speed rating of another of the IC dice;
   the coupling of the IC dice to respective voltage tuners includes coupling a first voltage tuner of the plurality of voltage tuners to a first IC die on the interposer; and
   the programming includes programming the first voltage tuner to reduce an input voltage level and output the reduced voltage to the first IC die.

10. The method of claim 9, wherein the programming includes programming voltage tuners of the plurality of voltage tuners other than the first voltage tuner to provide the input voltage without change to the respective IC dice.

11. The method of claim 9, wherein the programming includes programming each voltage tuner of the plurality of voltage tuners other than the first voltage tuner to reduce an input voltage and output the reduced voltage to the respective IC die.

12. The method of claim 8, further comprising:
   attaching the interposer to a package substrate.

13. The method of claim 8, wherein the IC dice are functionally equivalent.

14. An electronic system, comprising:
   a printed circuit board;
   a semiconductor package mounted on the printed circuit board, wherein the semiconductor package includes:
      a package substrate;
      an interposer disposed on the package substrate; and
      a plurality of integrated circuit (IC) dice disposed on and intercoupled via the interposer, a first IC die of the plurality of IC dice having a clock speed rating that is greater than a clock speed rating of another of the IC dice; and
   a plurality of programmable voltage tuners disposed-in a circuit layer of the interposer and coupled to the plurality of IC dice for providing power to the plurality of IC dice, respectively, wherein:
      a first voltage tuner of the plurality of voltage tuners is coupled to the first IC die; and
      the first voltage tuner is programmed to reduce a voltage level of voltage input to the first voltage tuner and output the reduced voltage to the first IC die.

* * * * *